US009480175B2

(12) United States Patent
Wei et al.

(10) Patent No.: US 9,480,175 B2
(45) Date of Patent: Oct. 25, 2016

(54) CASE STRUCTURE AND ELECTRONIC DEVICE WITH CASE STRUCTURE THEREOF

(71) Applicant: Wistron Corporation, New Taipei (TW)

(72) Inventors: Ren-Jing Wei, New Taipei (TW); Kuang-Hung Chen, New Taipei (TW); Chi-Hai Tso, New Taipei (TW)

(73) Assignee: WISTRON CORPORATION, New Taipei (TW)

( * ) Notice: Subject to any disclaimer, the term of this patent is extended or adjusted under 35 U.S.C. 154(b) by 847 days.

(21) Appl. No.: 13/672,153

(22) Filed: Nov. 8, 2012

(65) Prior Publication Data

US 2013/0182380 A1 Jul. 18, 2013

(30) Foreign Application Priority Data

Jan. 13, 2012 (TW) .............................. 101200895 A (51) Int. Cl.
| H05K 7/12 | (2006.01) |
|---|---|
| H05K 5/02 | (2006.01) |
| G06F 1/16 | (2006.01) |
| H05K 5/00 | (2006.01) |

(52) U.S. Cl.
CPC ........... *H05K 5/0221* (2013.01); *G06F 1/1616* (2013.01); *G06F 1/1654* (2013.01); *H05K 5/0239* (2013.01); *G06F 1/1669* (2013.01); *G06F 1/1671* (2013.01); *G06F 1/1679* (2013.01); *H05K 5/0013* (2013.01); *Y10S 292/11* (2013.01)

(58) Field of Classification Search
CPC .... G06F 1/169; G06F 1/1679; G06F 1/1671; G06F 1/1692; G06F 1/1669; G06F 3/021; G06F 3/03541; H04M 1/0237; H04M 1/0239; F16B 5/065; F16B 21/073; F16B 5/0657; H05K 5/0221; H05K 5/0013; H05K 5/0239; Y10S 292/37; Y10S 292/11; E05B 65/006; E05C 9/02; E05C 19/06; E05C 9/185; H01H 2225/028
USPC ............ 361/679.01, 679.17, 679.43, 679.55, 361/679.58, 725, 727, 801; 312/222, 293.1; 439/347; 292/8, 170; 379/433.12; 428/100; 206/467, 468
See application file for complete search history.

(56) References Cited

U.S. PATENT DOCUMENTS

| 7,986,524 B2 * | 7/2011 | Dong ..................... G06F 1/1626 312/223.1 |
| 2007/0077788 A1 * | 4/2007 | Jiang .................... H05K 5/0221 439/71 |

(Continued)

*Primary Examiner* — James Wu
(74) *Attorney, Agent, or Firm* — Muncy, Geissler, Olds & Lowe, P.C.

(57) ABSTRACT

A case structure and an electronic device with the case structure thereof are disclosed. The case structure includes a main body, an outer cover, a first button structure, and a sliding element. The outer cover includes a locking member, a retaining block, and an accommodation portion. The locking member and the retaining block can be detachably connected to the main body. The first button structure is installed in the accommodation portion and includes a first extension member extended to a locking notch. A hook structure is connected to the retaining block. When the first button structure slides toward a first moving direction, the first extension member drives the sliding element, such that the protruding member pushes the retaining block to be detached from the hook structure, and therefore the outer cover is lifted to be detached from the main body.

15 Claims, 10 Drawing Sheets

(56) References Cited

U.S. PATENT DOCUMENTS

2011/0052955 A1* 3/2011 Chu .................. H04M 1/0262
                                                            429/97

2012/0027511 A1* 2/2012 Wei .................. H05K 5/0013
                                                            403/381

* cited by examiner

CASE STRUCTURE AND ELECTRONIC DEVICE WITH CASE STRUCTURE THEREOF

BACKGROUND OF THE INVENTION

1. Field of the Invention

The present invention relates to a case structure and an electronic device with the case structure thereof; more particularly, the present invention relates to a case structure and an electronic device with the case structure thereof capable of utilizing an original button structure to detach an outer cover.

2. Description of the Related Art

With the progress of technology, basic requirements for modern electronic devices include not only powerful performance but also attractive appearance or uniqueness. Therefore, the design of replacing an outer cover of an electronic device has already been disclosed in the prior art.

In the prior art, the electronic device mainly utilizes either a notch detaching mechanism or a button detaching mechanism. The design of the notch detaching mechanism provides a notch design located between the outer cover and a main body, such that a user can detach the outer cover through the notch. In the button detaching mechanism, the user utilizes a button specially designed on the outer cover to detach the outer cover by means of pressing. However, in the prior art, both the notch detaching mechanism and the button detaching mechanism have to reserve a space for the arrangement of the notch or the button, which occupies a certain amount of mechanical space, and may possibly affect the integrity of the appearance of the electronic device.

Therefore, there is a need to provide a case structure and an electronic device with the case structure thereof to mitigate and/or obviate the aforementioned problems.

SUMMARY OF THE INVENTION

It is an object of the present invention to provide a case structure capable of utilizing an original button structure to achieve the function of detaching an outer cover.

It is another object of the present invention to provide an electronic device with the case structure.

To achieve the abovementioned objects, the case structure of the present invention comprises a main body, an outer cover, a first button structure and a sliding element. The outer cover comprises a locking member, a retaining block and an accommodation portion. The locking member and the retaining block can be detachably connected to the main body. The first button structure is installed in the accommodation portion of the outer cover. The first button structure comprises a first extension member. The sliding element is installed in the main body. The sliding element comprises a hook structure, a protruding member and a locking notch. The hook structure is connected to the retaining block. The protruding member is adjacent to the retaining block. The first extension member is extended and detachably connected to the locking notch. When the first button structure slides toward a first moving direction, the first extension member drives the sliding element, such that the protruding member pushes the retaining block to be detached from the hook structure, and therefore the outer cover is lifted to be detached from the main body. Further, when the first button structure slides toward the first moving direction, the first extension member of the first button structure is detached from the locking notch.

The electronic device of the present invention comprises a case structure. The case structure comprises a main body, an outer cover, a first button structure and a sliding element. The outer cover comprises a locking member, a retaining block and an accommodation portion. The locking member and the retaining block can be detachably connected to the main body. The first button structure is installed in the accommodation portion of the outer cover. The first button structure comprises a first extension member. The sliding element is installed in the main body. The sliding element comprises a hook structure, a protruding member and a locking notch. The hook structure is connected to the retaining block. The protruding member is adjacent to the retaining block. The first extension member is extended and detachably connected to the locking notch. When the first button structure slides toward a first moving direction, the first extension member drives the sliding element, such that the protruding member pushes the retaining block to be detached from the hook structure, and therefore the outer cover is lifted to be detached from the main body. Further, when the first button structure slides toward the first moving direction, the first extension member of the first button structure is detached from the locking notch.

According to another embodiment of the present invention, a case structure comprises a main body, an outer cover, a first button structure, a second button structure and a sliding element. The outer cover comprises a locking member, a retaining block and an accommodation portion. The locking member and the retaining block can be detachably connected to the main body. The first button structure is installed in the accommodation portion of the outer cover. The first button structure comprises a first extension member and a position-limiting block. The second button structure is installed in the accommodation portion of the outer cover, and comprises a position-limiting structure mutually engaged with the position-limiting block. The sliding element is installed in the main body. The sliding element comprises a hook structure, a protruding member and a locking notch. The hook structure is connected to the retaining block. The protruding member is adjacent to the retaining block. The first extension member is extended and detachably connected to the locking notch. The second button structure presses toward a vertical moving direction and then slides toward a horizontal moving direction, such that at least a portion of the second button structure slides under the outer cover to detach the position-limiting structure from the position-limiting block. Therefore, the first button structure can press toward the vertical moving direction and then slide toward another horizontal moving direction, such that at least a portion of the first button structure slides under the outer cover. When the first button structure slides, the first extension member drives the sliding element, such that the protruding member pushes the retaining block to be detached from the hook structure, and therefore the outer cover is lifted to be detached from the main body. Further, when the first button structure slides, the first extension member of the first button structure is detached from the locking notch.

Other objects, advantages, and novel features of the invention will become more apparent from the following detailed description when taken in conjunction with the accompanying drawings.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

In the drawings, wherein similar reference numerals denote similar elements throughout the several views.

DETAILED DESCRIPTION OF THE PREFERRED EMBODIMENT

Figure 1:
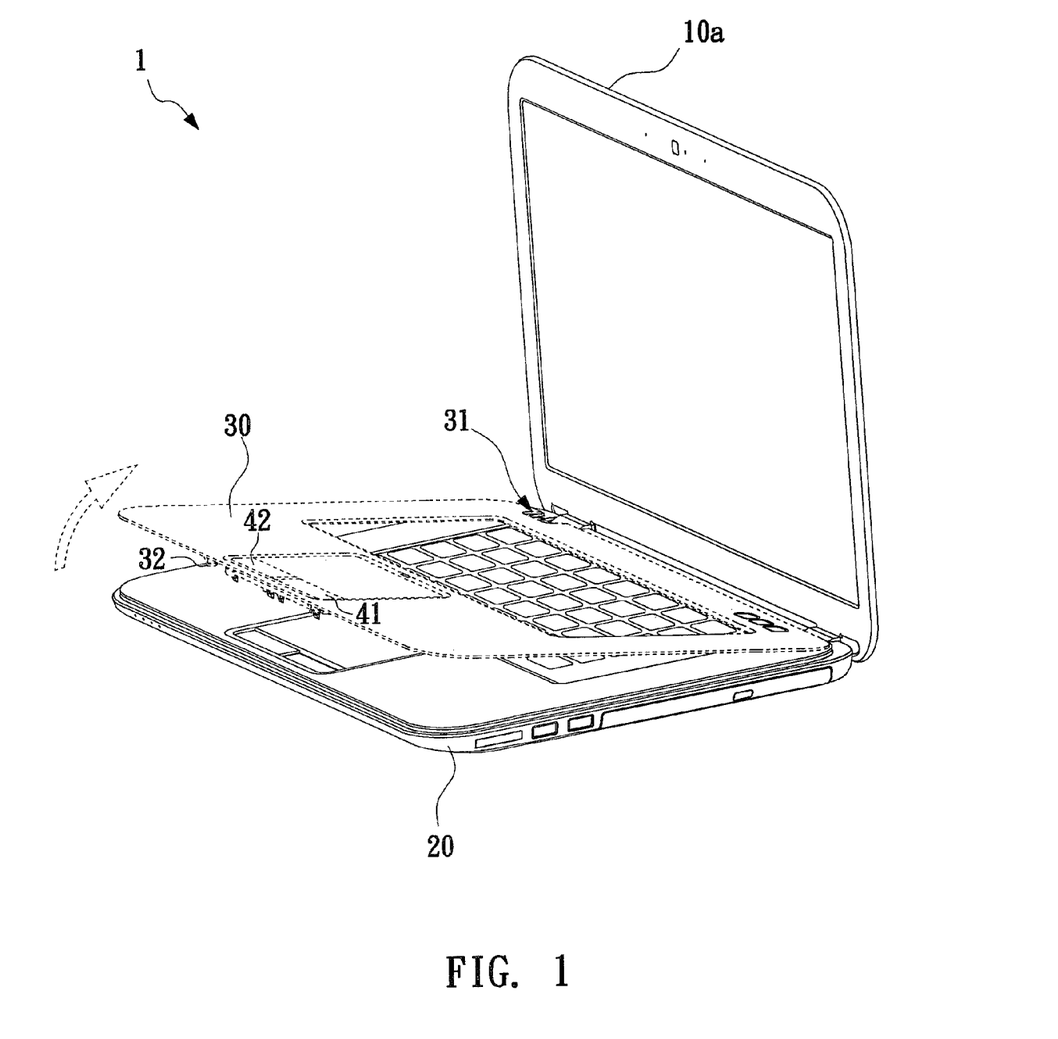
FIG. 1 illustrates a schematic drawing showing the appearance of an electronic device with a case structure according to the present invention.

Please refer to FIG. 1, which illustrates a schematic drawing showing the appearance of an electronic device with a case structure according to the present invention.

In one embodiment of the present invention, the electronic device 1 can be, but not limited to, a laptop computer. The electronic device 1 comprises a case structure 10a. The case structure 10a comprises a main body 20 and an outer cover 30. The outer cover 30 is detachable from main body 20. The outer cover 30 comprises a locking member 31 and a retaining block 32. Firstly, the locking member 31 is mutually engaged with the main body 20 by embedding or other equivalent ways. Then, the retaining block 32 is fastened to the main body 20. When the outer cover 30 needs to be detached from the main body 20, the retaining block 32 is firstly detached, and the locking member 31 is then detached from the main body 20. The structure of detaching the outer cover 30 from the main body 20 will be described in more detail hereinafter. Please note that because the mechanism of engaging two elements through embedding has been widely applied in known arts, and the structure of the locking member 31 is not the key feature of the present invention, there is no need for additional explanation regarding the structure.

Figure 2A:
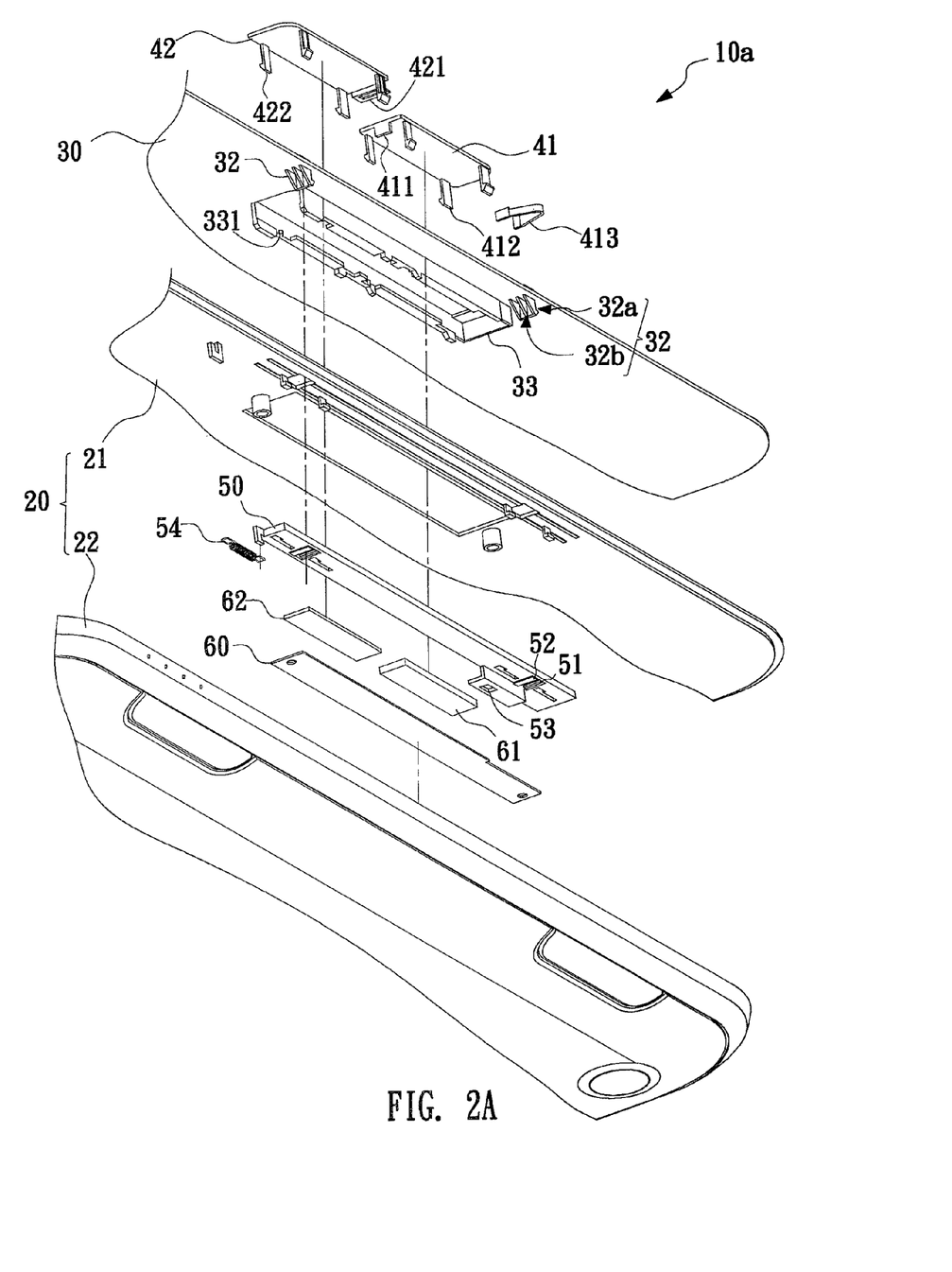
FIG. 2A illustrates a structural exploded view of the case structure according to a first embodiment of the present invention.
Figure 2B:
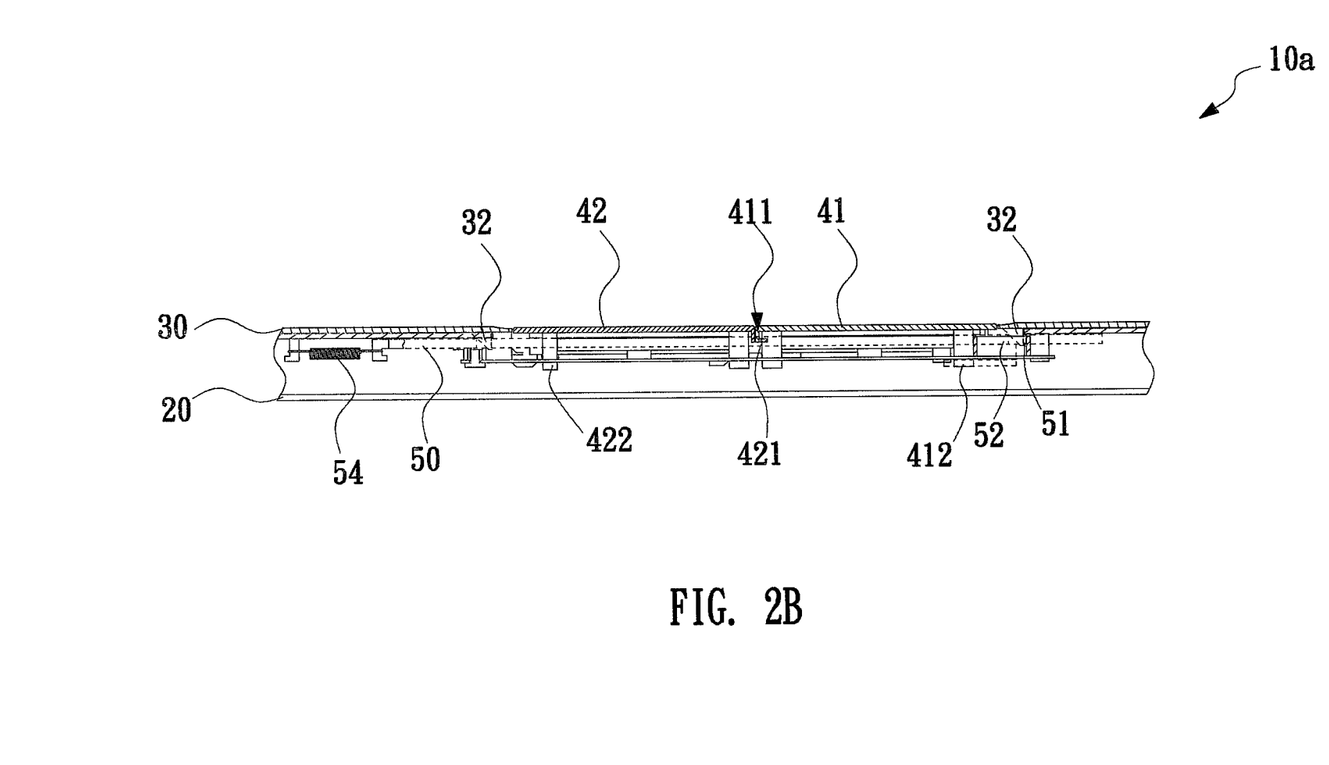
FIG. 2B illustrates a lateral view of the case structure according to the first embodiment of the present invention.

Then, please refer to both FIG. 2A and FIG. 2B regarding the case structure according to a first embodiment of the present invention, wherein FIG. 2A illustrates a structural exploded view of the case structure according to the first embodiment of the present invention, and FIG. 2B illustrates a lateral view of the case structure according to the first embodiment of the present invention.

In the first embodiment of the present invention, the case structure 10a comprises a main body 20, an outer cover 30, a first button structure 41, a second button structure 42 and a sliding element 50. The main body 20 may, without limiting the scope of the disclosure, comprise an upper cover 21 and a lower cover 22 used for covering a circuit board 60 or other electronic elements. The outer cover 30 comprises a locking member 31 (as shown in FIG. 1), a retaining block 32 and an accommodation portion 33. The retaining block 32 comprises a hook-shaped portion 32a and an inclined plane 32b. The locking member 31 and the hook-shaped portion 32a of the retaining block 32 are used for fastening the outer cover 30 to the main body 20. The accommodation portion 33 is used for installing the first button structure 41 and the second button structure 42.

The first button structure 41 and the second button structure 42 are both buttons of the electronic device 1, and are adjacent to each other. In the first embodiment of the present invention, the first button structure 41 and the second button structure 42 are, but not limited to, a right button and a left button disposed in a lower portion of a touch pad, respectively. Therefore, a first button module 61 and a second button module 62 can be installed under the first button structure 41 and the second button structure 42. The first button module 61 and the second button module 62 are disposed on the circuit board 60, such that if the first button structure 41 and the second button structure 42 are being pressed, electric signals would be generated accordingly. In the first embodiment of the present invention, the first button structure 41 comprises a position-limiting block 411, and the second button structure 42 comprises a position-limiting structure 421, wherein the position-limiting structure 421 is mutually engaged with the position-limiting block 411. The first button structure 41 further comprises a first extension member 412 used for being connected to the sliding element 50.

The sliding element 50 is installed between the upper cover 21 and the lower cover 22 of the main body 20, and can slide leftward and rightward. The sliding element 50 comprises a hook structure 51, a protruding member 52 and a locking notch 53. The hook structure 51 is connected to the retaining block 32 of the outer cover 30, and is used for fastening the outer cover 30. The protruding member 52 is adjacent to the retaining block 32, and an inclined plane of the protruding member 52 is also close to the inclined plane 32b of the retaining block 32. The locking notch 53 is cooperated with the first extension member 412 of the first button structure 41, and the first extension member 412 is extended and detachably connected to the locking notch 53. Therefore, when the first button structure 41 slides, the first extension member 412 drives the sliding element 50 to move at the same time. The sliding element 50 is further jointed to a first elastic element 54. The first elastic element 54 can be, but not limited to, a spring, an elastic piece or other equivalent apparatus with elasticity. After the sliding element 50 slides, the sliding element 50 can then return to its original position by the elasticity of the first elastic element 54.

With regard to the process of detaching the outer cover 30 from the main body 20, please refer to FIGS. 3A-5B and corresponding description for more details.

Figure 3A:
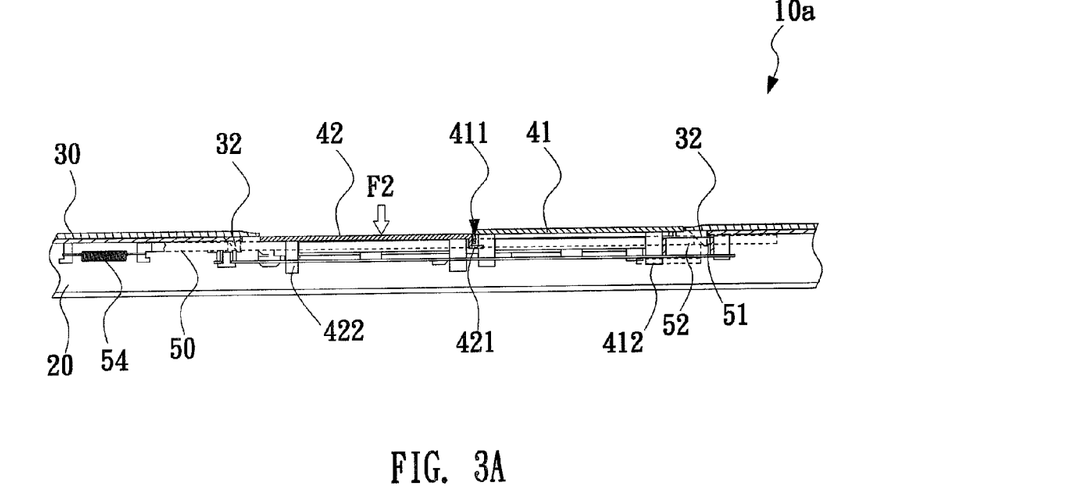
FIG. 3A illustrates an operational lateral view showing a second button structure being pressed according to the first embodiment of the case structure of the present invention.
Figure 3B:
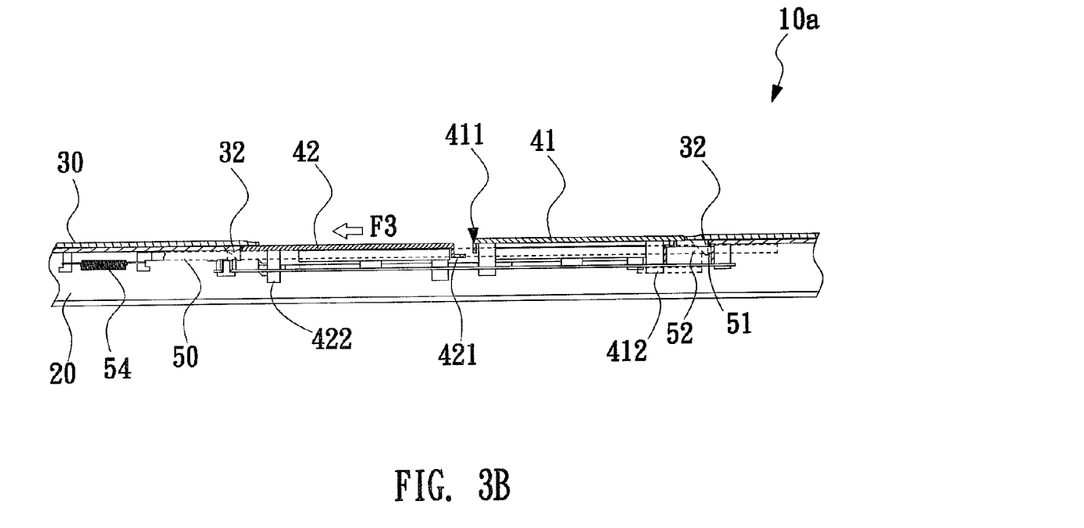
FIG. 3B illustrates an operational lateral view showing the second button structure sliding according to the first embodiment of the case structure of the present invention.

First of all, please refer to FIG. 3A and FIG. 3B, wherein FIG. 3A illustrates an operational lateral view showing the second button structure being pressed according to the first embodiment of the case structure of the present invention, and FIG. 3B illustrates an operational lateral view showing the second button structure sliding according to the first embodiment of the case structure of the present invention.

In the first embodiment of the present invention, because the first button structure 41 and the second button structure 42 are engaged with each other by the position-limiting block 411 and the position-limiting structure 421, the second button structure 42 is firstly pressed toward a second moving direction F2, such that the position-limiting structure 421 is detached from the position-limiting block 411. Then, the second button structure 42 slides toward a third moving direction F3, such that at least a portion of the second button structure 42 slides under the outer cover 30. The second moving direction F2 is a vertical moving direction, and the third moving direction F3 is a horizontal moving direction, therefore the third moving direction F3 and the second moving direction F2 are substantially perpendicular to each other.

Figure 4:
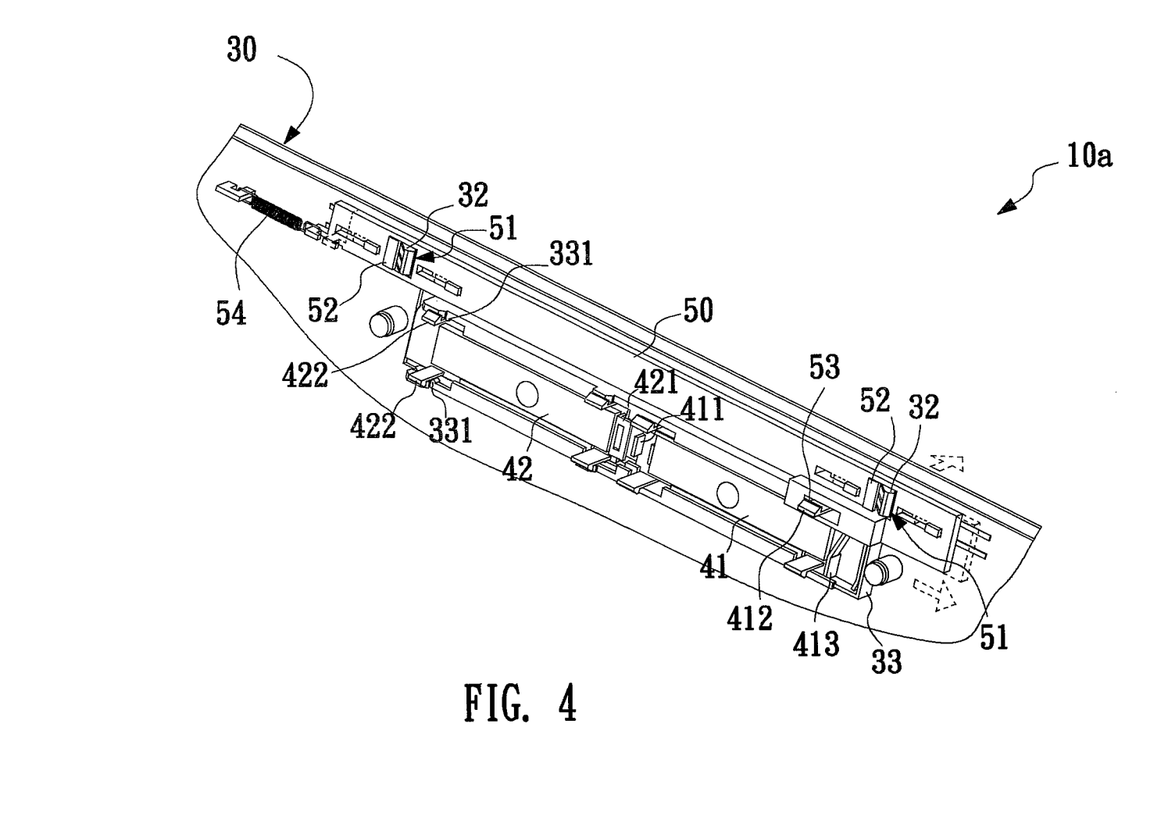
FIG. 4 illustrates a bottom view showing the first button structure being detached from the second button structure according to the first embodiment of the case structure of the present invention.

As shown in FIG. 4. FIG. 4 illustrates a bottom view showing the first button structure being detached from the second button structure according to the first embodiment of the case structure of the present invention.

After the position-limiting structure 421 is detached from the position-limiting block 411, the first button structure 41 can move freely. Please note that the second button structure 42 further comprises a second extension member 422. The second button structure 42 can utilize the second extension member 422 to be engaged with a convex point 331 of the accommodation portion 33, such that the second button structure 42 would not automatically return to its original position, thereby preventing the position-limiting structure 421 of the second button structure 42 from being engaged with the position-limiting block 411 again.

Figure 5A:
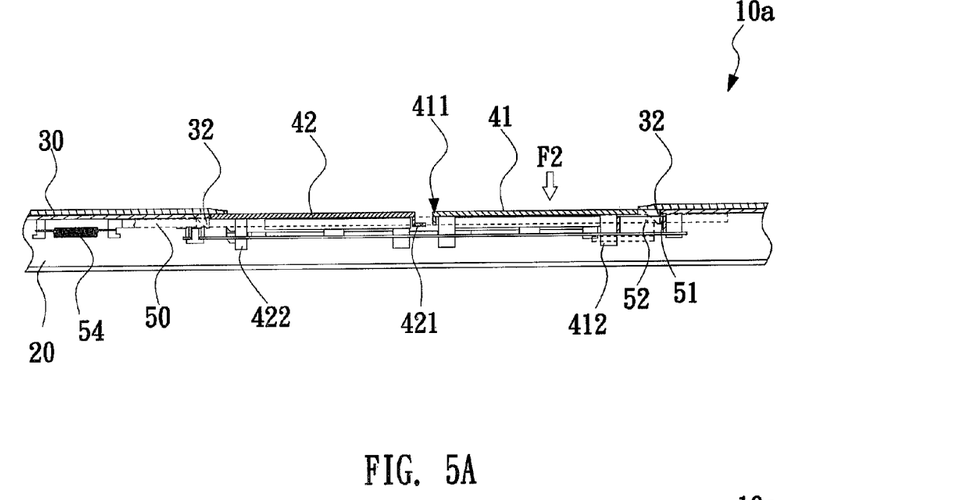
FIG. 5A illustrates an operational lateral view showing the first button structure being pressed according to the first embodiment of the case structure of the present invention.
Figure 5B:
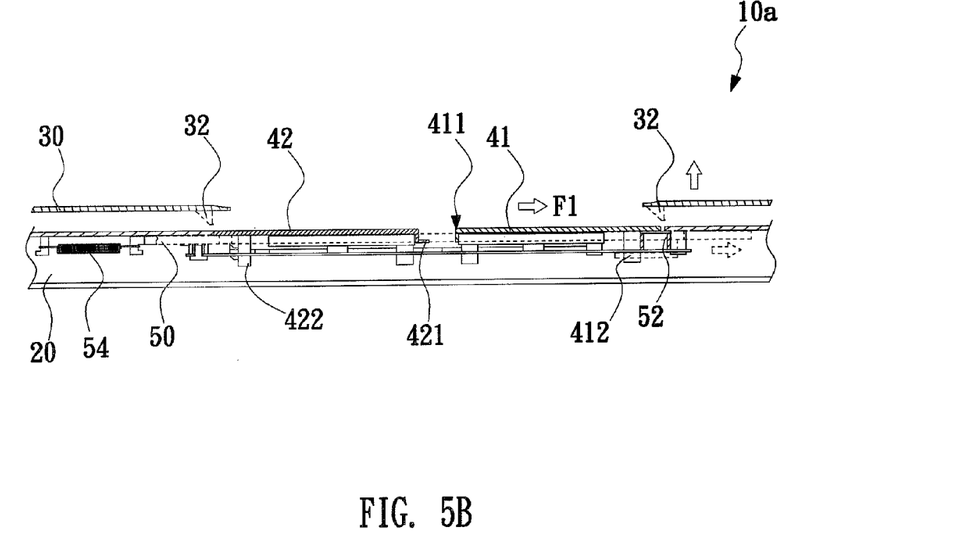
FIG. 5B illustrates an operational lateral view showing the first button structure sliding according to the first embodiment of the case structure of the present invention.

Then, please refer to FIG. 5A and FIG. 5B, wherein FIG. 5A illustrates an operational lateral view showing the first button structure being pressed according to the first embodiment of the case structure of the present invention, and FIG. 5B illustrates an operational lateral view showing the first button structure sliding according to the first embodiment of the case structure of the present invention.

After the first button structure 41 and the second button structure 42 are detached, the first button structure 41 is pressed toward the second moving direction F2, such that the height of the first button structure 41 would be lower than the position of the outer cover 30. Then, the first button structure 41 slides toward a first moving direction F1, such that at least a portion of the first button structure 41 slides under the outer cover 30. The first moving direction F1 is a horizontal moving direction, therefore the first moving direction F1 and the second moving direction F2 are substantially perpendicular to each other. Further, when the first button structure 41 slides toward the first moving direction F1, the first extension member 412 of the first button structure 41 drives the sliding element 50. As a result, the protruding member 52 of the sliding element 50 would push against the inclined plane 32b of the retaining block 32 of the outer cover 30, such that the outer cover 30 is lifted to be detached from the main body 20. Meanwhile, along with the outer cover 30, the first button structure 41 and the second button structure 42 are detached from the locking notch 53 of the sliding element 50 to leave the main body 20.

The first button structure 41 is further jointed to a second elastic element 413. The second elastic element 413 can be, but not limited to, a spring, an elastic piece or other equivalent apparatus with elasticity. After the first button structure 41 slides, the first button structure 41 can return to its original position by means of the elasticity of the second elastic element 413.

Additionally, if a user wants to assemble the outer cover 30 and the main body 20, the user can firstly engage the position-limiting block 411 with the position-limiting structure 421. That is, both the first button structure 41 and the second button structure 42 are returned to their previously-engaged positions. Then, the locking member 31 is utilized to be embedded to the main body 20. Next, the hook-shaped portion 32a of the retaining block 32 is engaged with the hook structure 51 of the sliding element 50. Finally, the case structure 10a can be recovered to its assembly structure as shown in FIG. 2B. According to the abovementioned process, the outer cover 30 can be conveniently detached from or assemble with the main body 20.

Figure 6A:
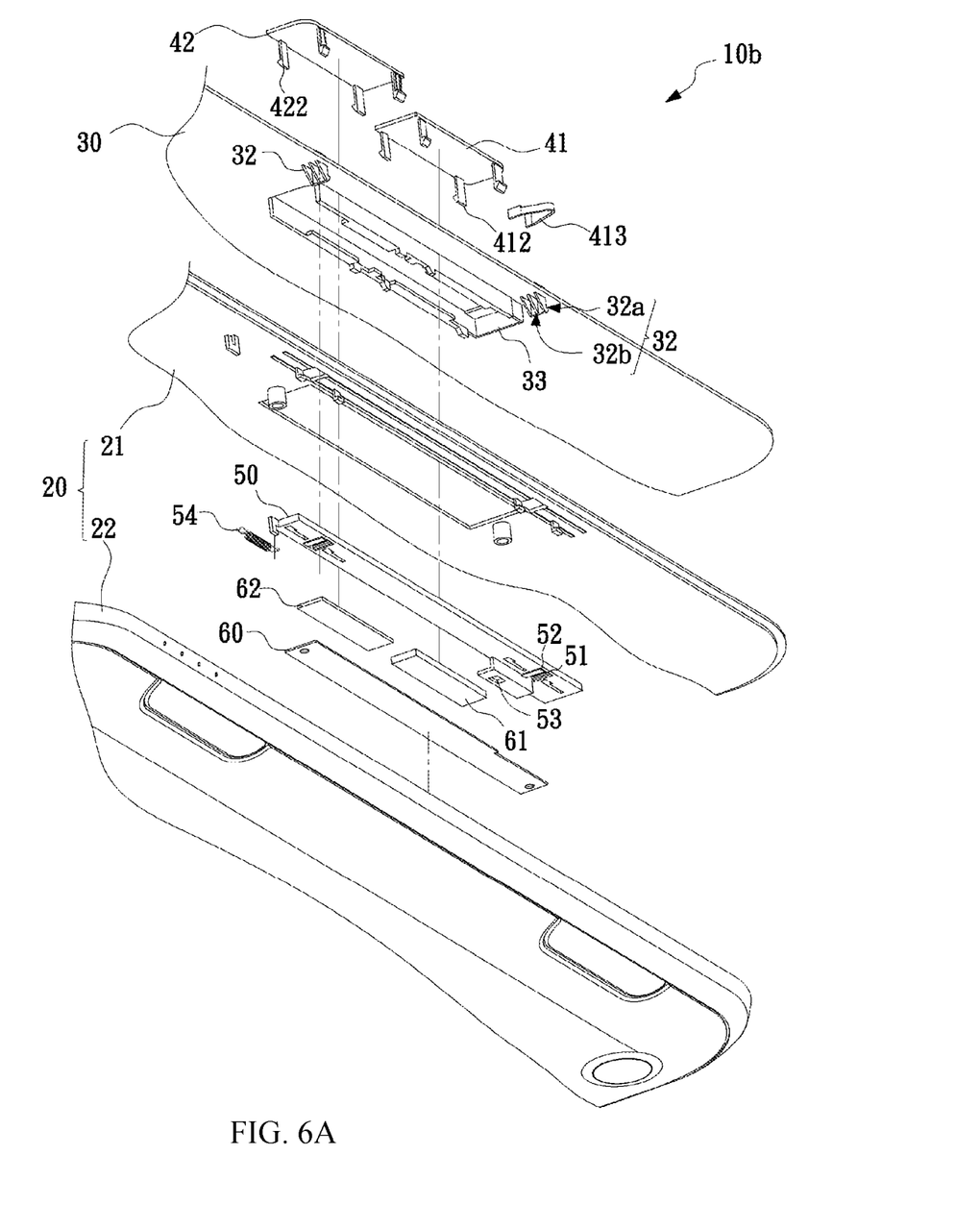
FIG. 6A illustrates a structural exploded view of the case structure according to a second embodiment of the present invention.
Figure 6B:
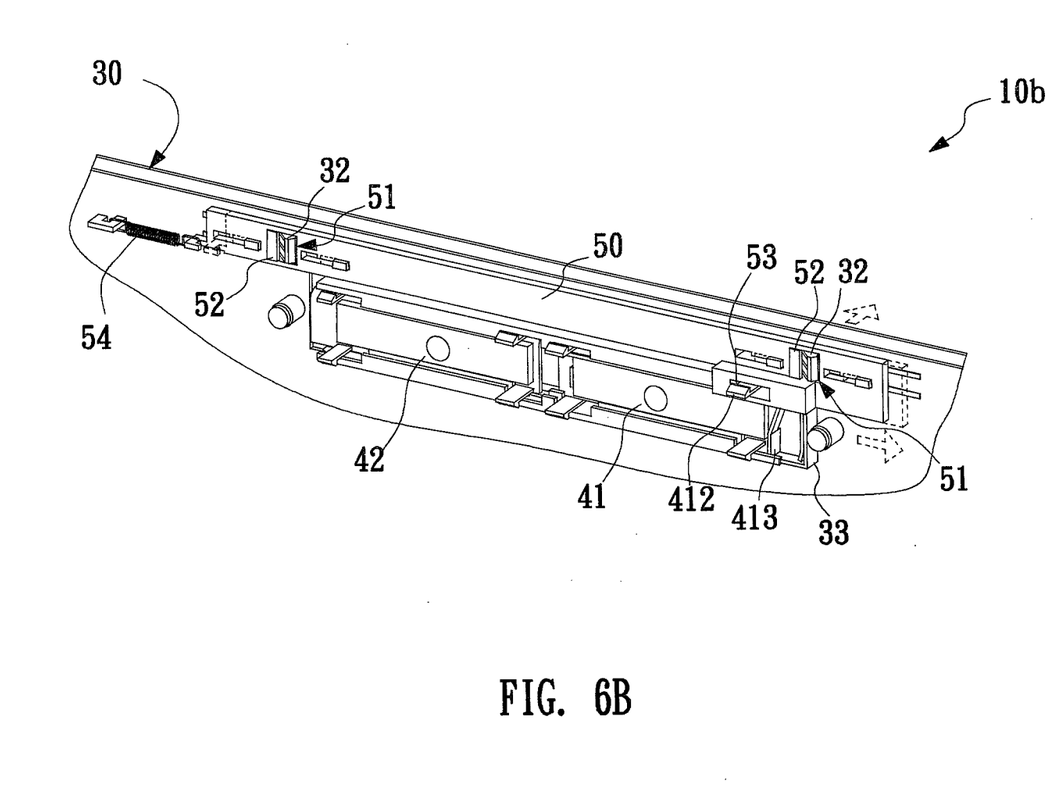
FIG. 6B illustrates an operational schematic drawing of the first button structure according to the second embodiment of the case structure of the present invention.

Then, please refer to FIG. 6A and FIG. 6B, wherein FIG. 6A illustrates a structural exploded view of the case structure according to a second embodiment of the present invention, and FIG. 6B illustrates an operational schematic drawing of the first button structure according to the second embodiment of the case structure of the present invention.

In the second embodiment of the present invention, there are no position-limiting block 411 and position-limiting structure 421 installed between the first button structure 41 and the second button structure 42 of the case structure 10b. Moreover, the accommodation portion 33 of the outer cover 30 does not have the convex point 331. Therefore, after the user directly presses the first button structure 41 toward the second moving direction F2, the height of the first button structure 41 would be lower than the position of the outer cover 30 as shown in FIG. 5A. Then, the first button structure 41 slides toward the first moving direction F1, such that at least a portion of the first button structure 41 slides under the outer cover 30 as shown in FIG. 5B. Therefore, the first button structure 41 can drive the sliding element 50, such that the protruding member 52 of the sliding element 50 can push against the inclined plane 32b of the retaining block 32 to detach the outer cover 30. Because the mechanism of detaching the outer cover 30 is similar to that in the first embodiment, there is no need for further description.

Figure 7A:
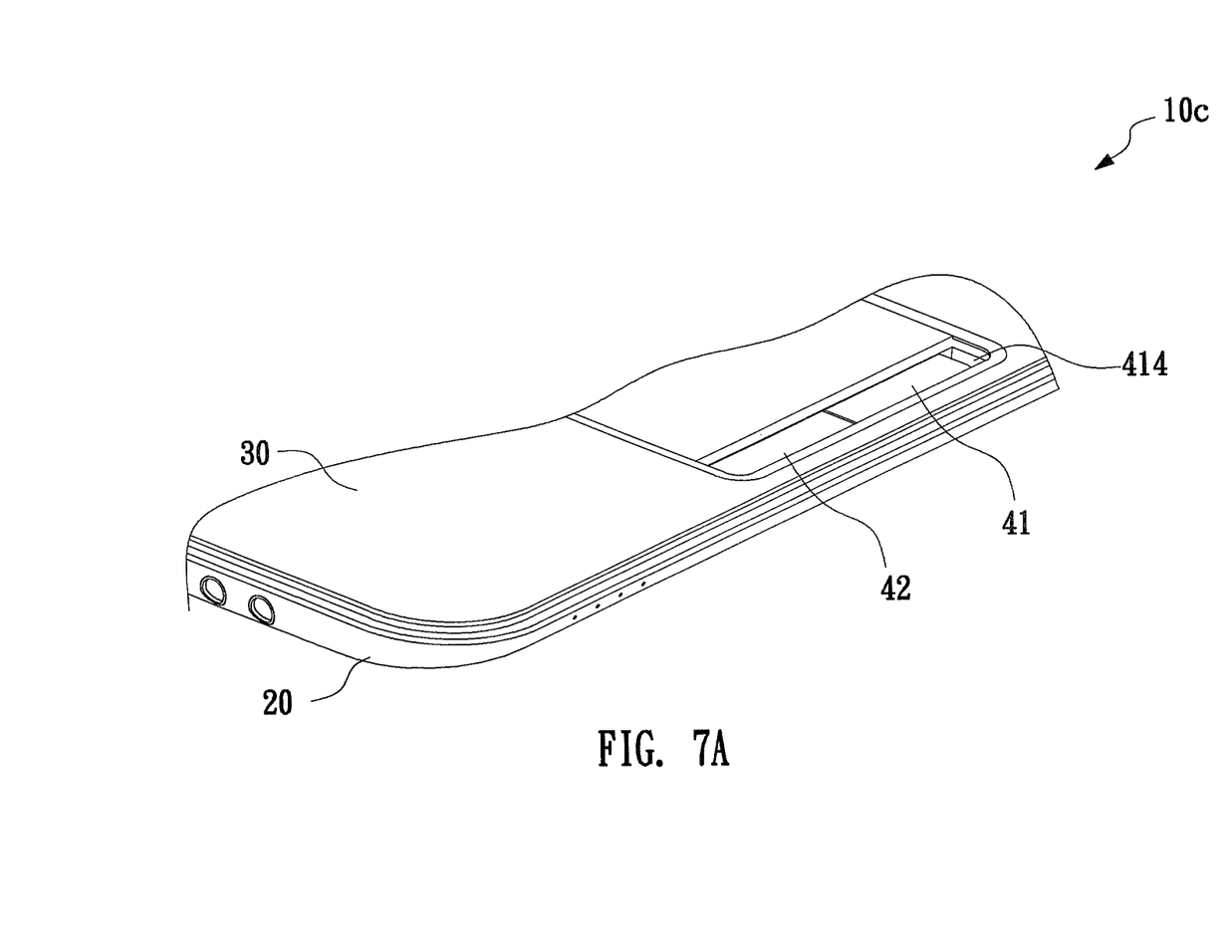
FIG. 7A illustrates a schematic drawing of the case structure according to a third embodiment of the present invention.
Figure 7B:
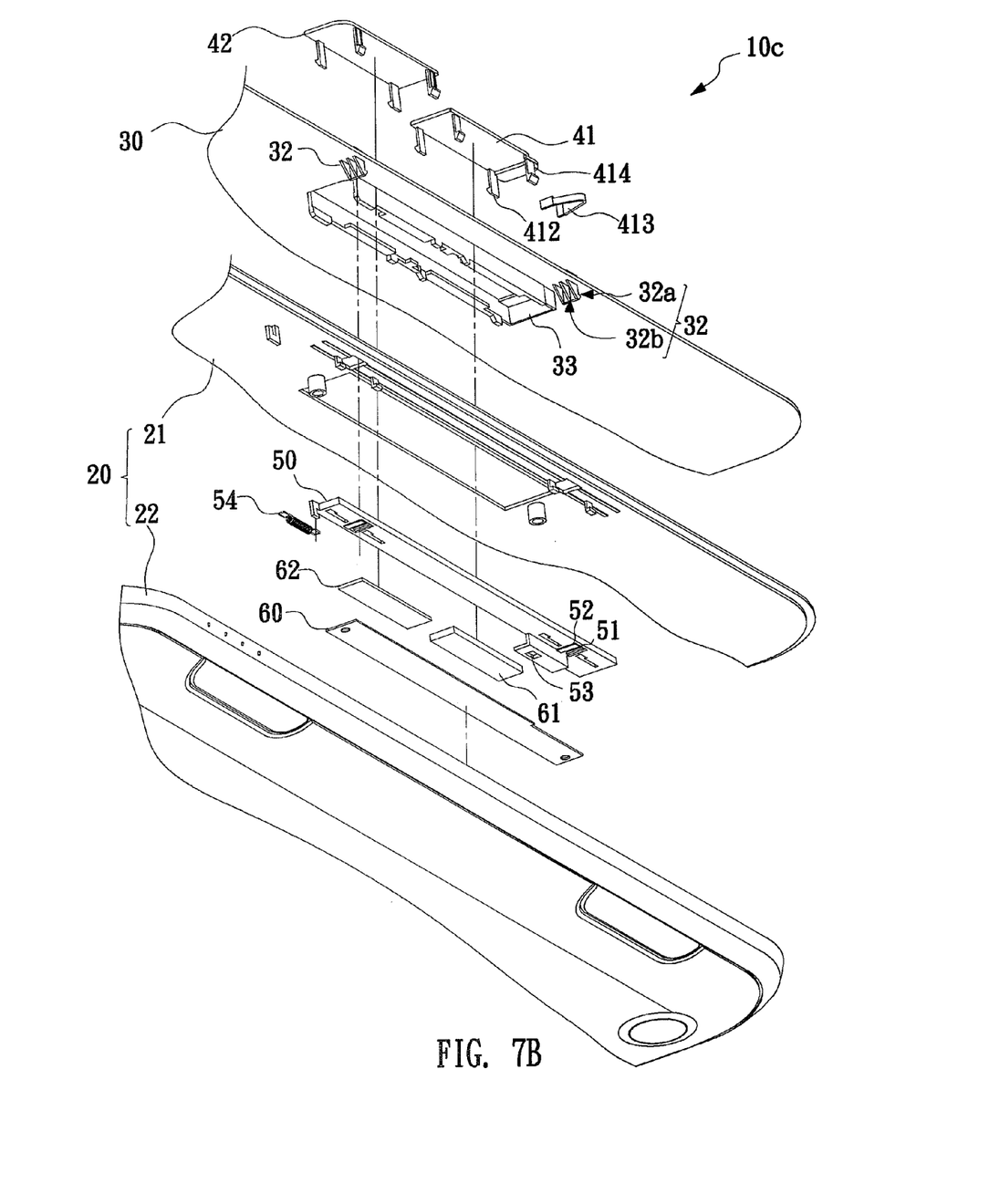
FIG. 7B illustrates a structural exploded view of the case structure according to the third embodiment of the present invention.

Finally, please refer to FIG. 7A and FIG. 7B, wherein FIG. 7A illustrates a schematic drawing of the case structure according to a third embodiment of the present invention, and FIG. 7B illustrates a structural exploded view of the case structure according to the third embodiment of the present invention.

In the third embodiment of the present invention, the first button structure 41 of the case structure 10c further comprises an indentation portion 414, wherein the height of the indentation portion 414 is lower than the position of the outer cover 30. When the first button structure 41 slides toward the first moving direction F1, the indentation portion 414 would directly slide under the outer cover 30. As a result, the first button structure 41 directly utilizes the sliding operation to drive the sliding element 50, and then utilizes the hook structure 51 of the sliding element 50 to push against the retaining block 32 to detach the outer cover 30.

Because the mechanism of detaching the outer cover 30 is similar to that in the first embodiment, there is no need for further description.

According to the above description, the case structures 10a, 10b and 10c can all utilize their original button structures to conveniently detach the outer cover 30 without the need of arranging extra button or notch structures.

Although the present invention has been explained in relation to its preferred embodiments, it is to be understood that many other possible modifications and variations can be made without departing from the spirit and scope of the invention as hereinafter claimed.

What is claimed is:

1. A case structure, comprising:
   a main body;
   an outer cover, comprising:
      a locking member, detachably connected to the main body;
      a retaining block, detachably connected to the main body; and
      an accommodation portion;
   a first button structure installed in the accommodation portion of the outer cover, the first button structure comprising a first extension member and a position-limiting block;
   a second button structure, installed in the accommodation portion of the outer cover, the second button structure comprising a position-limiting structure mutually engaged with the position-limiting block;
   a first elastic element installed in the main body; and
   a sliding element installed in the main body and jointed to the first elastic element, the sliding element comprising:
      a hook structure connected to the retaining block;
      a protruding member adjacent to the retaining block; and
      a locking notch, wherein the first extension member is extended and detachably connected to the locking notch; wherein the second button structure presses toward a second moving direction and then slides toward a third moving direction, such that at least a portion of the second button structure slides under the outer cover to detach the position-limiting structure from the position-limiting block, such that the first button structure can slide toward a first moving direction, then the first extension member drives the sliding element such that the protruding member pushes the retaining block to be detached from the hook structure, the outer cover is lifted to be detached from the main body, and the first extension member of the first button structure is detached from the locking notch, wherein the first moving direction and the second moving direction are substantially perpendicular to each other; the third moving direction and the second moving direction are substantially perpendicular to each other; wherein after the sliding element slides, the sliding element can return to an original position by the first elastic element; wherein the first button structure is further connected to a second elastic element, such that after the first button structure slides, the first button structure can return to an original position by the second elastic element.

2. The case structure as claimed in claim 1, wherein the retaining block comprises:
   a hook-shaped portion, used for being engaged with the hook structure; and
   an inclined plane, adjacent to the protruding member, allowing the protruding member to push against the retaining block.

3. The case structure as claimed in claim 1, wherein the first button structure comprises an indentation portion, such that when the first button structure slides toward the first moving direction, the indentation portion slides under the outer cover.

4. The case structure as claimed in claim 1, wherein the first button structure firstly presses toward a second moving direction and then slides toward the first moving direction, such that at least a portion of the first button structure slides under the outer cover.

5. The case structure as claimed in claim 4, wherein the second button structure further comprises a second extension member, and the accommodation portion further comprises a convex point, after the second button structure slides toward the third moving direction to be under the outer cover, the second extension member is cooperated with the convex point to fasten the second button structure.

6. An electronic device with a case structure, comprising:
   the case structure, comprising:
      a main body;
      an outer cover, comprising:
         a locking member, detachably connected to the main body;
         a retaining block, detachably connected to the main body; and
         an accommodation portion;
      a first button structure, installed in the accommodation portion of the outer cover, the first button structure comprising a first extension member and a position-limiting block; and
      a second button structure, installed in the accommodation portion of the outer cover, the second button structure comprising a position-limiting structure mutually engaged with the position-limiting block; and
      a sliding element, installed in the main body, the sliding element comprising:
         a hook structure, connected to the retaining block;
         a protruding member adjacent to the retaining block; and
         a locking notch, wherein the first extension member is extended and detachably connected to the locking notch; wherein the second button structure presses toward a second moving direction and then slides toward a third moving direction, such that at least a portion of the second button structure slides under the outer cover to detach the position-limiting structure from the position-limiting block, such that the first button structure can slide toward a first moving direction, then the first extension member drives the sliding element, such that the protruding member pushes the retaining block to be detached from the hook structure, the outer cover is lifted to be detached from the main body, and the first extension member of the first button structure is detached from the locking notch, wherein the first moving direction and the second moving direction are substantially perpendicular to each other; the third moving direction and the second moving direction are substantially perpendicular to each other.

7. The electronic device with the case structure as claimed in claim 6, wherein the retaining block comprises:

a hook-shaped portion, used for being engaged with the hook structure; and an inclined plane, adjacent to the protruding member, allowing the protruding member to push against the retaining block.

8. The electronic device with the case structure as claimed in claim 6 further comprising a first elastic element, installed in the main body and jointed to the sliding element, such that after the sliding element slides, the sliding element can return to an original position by the first elastic element.

9. The electronic device with the case structure as claimed in claim 6, wherein the first button structure is further connected to a second elastic element, such that after the first button structure slides, the first button structure can return to an original position by the second elastic element.

10. The electronic device with the case structure as claimed in claim 6, wherein the first button structure comprises an indentation portion, such that after the first button structure slides toward the first moving direction, the indentation is located under the outer cover.

11. The electronic device with the case structure as claimed in claim 6, wherein the first button structure firstly presses toward the second moving direction and then slides toward the first moving direction, such that at least a portion of the first button structure slides under the outer cover.

12. The electronic device with the case structure as claimed in claim 11, wherein the second button structure further comprises a second extension member, and the accommodation portion further comprises a convex point, after the second button structure slides toward the third moving direction, the second extension member is cooperated with the convex point to fasten the second button structure.

13. The electronic device with the case structure as claimed in claim 11 further comprising:
a first button module, located under the first button structure; and
a second button module, located under the second button structure.

14. A case structure, comprising:
a main body;
an outer cover, comprising:
a locking member, detachably connected to the main body;
a retaining block, detachably connected to the main body; and
an accommodation portion;
a first button structure installed in the accommodation portion of the outer cover, the first button structure comprising a first extension member and a position-limiting block;
a second button structure, installed in the accommodation portion of the outer cover, the second button structure comprising a position-limiting structure mutually engaged with the position-limiting block; and
a sliding element, installed in the main body, the sliding element comprising:
a hook structure, connected to the retaining block;
a protruding member adjacent to the retaining block; and
a locking notch, wherein the first extension member is extended and detachably connected to the locking notch; wherein the second button structure presses toward a vertical moving direction and then slides toward a horizontal moving direction, such that at least a portion of the second button structure slides under the outer cover to detach the position-limiting structure from the position-limiting block, such that the first button structure can press toward the vertical moving direction and then slide toward another horizontal moving direction, as a result at least a portion of the first button structure slides under the outer cover, when the first button structure slides, the first extension member drives the sliding element, such that the protruding member pushes the retaining block to be detached from the hook structure, the outer cover is lifted to be detached from the main body, and the first extension member of the first button structure is detached from the locking notch.

15. The case structure as claimed in claim 14, wherein the second button structure further comprises a second extension member, and the accommodation portion further comprises a convex point, after the second button structure slides toward the horizontal moving direction to be under the outer cover, the second extension member is cooperated with the convex point to fasten the second button structure.

* * * * *